(12) United States Patent
Iwai et al.

(10) Patent No.: US 7,842,133 B2
(45) Date of Patent: Nov. 30, 2010

(54) SINGLE CRYSTAL GROWING METHOD

(75) Inventors: Makoto Iwai, Kasugai (JP); Takanao Shimodaira, Nagoya (JP); Shuhei Higashihara, Nagoya (JP); Takatomo Sasaki, Suita (JP); Yusuke Mori, Suita (JP); Fumio Kawamura, Suita (JP); Shiro Yamasaki, Nishikasugai-Gun (JP); Koji Hirata, Nishikasugai-Gun (JP)

(73) Assignees: NGK Insulators, Ltd., Nagoya (JP); Osaka University, Suita (JP); Toyoda Gosei Co., Ltd., Nishikasugai-Gun (JP)

( * ) Notice: Subject to any disclaimer, the term of this patent is extended or adjusted under 35 U.S.C. 154(b) by 19 days.

(21) Appl. No.: 12/190,230

(22) Filed: Aug. 12, 2008

(65) Prior Publication Data

US 2009/0000538 A1    Jan. 1, 2009

Related U.S. Application Data

(63) Continuation of application No. PCT/JP2007/054744, filed on Mar. 5, 2007.

(30) Foreign Application Priority Data

Mar. 6, 2006    (JP)    ............... 2006-059761

(51) Int. Cl.
*C30B 27/02*    (2006.01)
*C30B 28/10*    (2006.01)

(52) U.S. Cl. ............... 117/19; 117/20; 117/64; 117/71; 117/73; 117/82

(58) Field of Classification Search ............ 117/19, 117/20, 64, 71, 73, 82

See application file for complete search history.

(56) References Cited

U.S. PATENT DOCUMENTS

| | | | | |
|---|---|---|---|---|
| 3,087,707 | A * | 4/1963 | Moonan | 366/130 |
| D198,219 | S * | 5/1964 | Johnson | D21/373 |
| 3,184,118 | A * | 5/1965 | Webster | 222/189.1 |
| 5,352,036 | A * | 10/1994 | Haber et al. | 366/130 |
| 5,544,960 | A * | 8/1996 | Sommovigo et al. | 366/130 |
| 6,379,032 | B1 * | 4/2002 | Sorensen | 366/130 |
| 6,843,849 | B1 * | 1/2005 | Sasaki et al. | 117/30 |
| 2004/0183090 | A1 * | 9/2004 | Kitaoka et al. | 257/103 |
| 2006/0169197 | A1 * | 8/2006 | Sasaki et al. | 117/2 |
| 2007/0209575 | A1 * | 9/2007 | Iwai et al. | 117/78 |
| 2007/0215035 | A1 * | 9/2007 | Kitaoka et al. | 117/84 |
| 2009/0000538 | A1 * | 1/2009 | Iwai et al. | 117/19 |

FOREIGN PATENT DOCUMENTS

JP    02-088494 A1    3/1990

(Continued)

OTHER PUBLICATIONS

U.S. Appl. No. 12/192,428, filed Aug. 15, 2008, Iwai et al.

(Continued)

*Primary Examiner*—Robert M Kunemund
*Assistant Examiner*—G. Nagesh Rao
(74) *Attorney, Agent, or Firm*—Burr & Brown

(57) ABSTRACT

In a method of growing a single crystal by melting a raw material within a vessel under a nitrogenous and non-oxidizing atmosphere, the vessel is oscillated and the melted raw material is contacted with an agitation medium made of a solid unreactive with the melted raw material.

11 Claims, 8 Drawing Sheets

FOREIGN PATENT DOCUMENTS

| | | | |
|---|---|---|---|
| JP | 2001-039791 | A1 | 2/2001 |
| JP | 2005-012171 | A1 | 1/2005 |
| JP | 2005-247615 | A1 | 9/2005 |
| JP | 2005-263622 | A1 | 9/2005 |
| WO | WO 2004/083498 | A1 | 9/2004 |
| WO | WO 2005/095682 | A1 | 10/2005 |

OTHER PUBLICATIONS

U.S. Appl. No. 12/212,722, filed Sep. 18, 2008, Iwai et al.
U.S. Appl. No. 12/234,786, filed Sep. 22, 2008, Imai et al.
U.S. Appl. No. 12/234,799, filed Sep. 22, 2008, Imai et al.
U.S. Appl. No. 12/284,470, filed Sep. 22, 2008, Ichimura et al.
U.S. Appl. No. 12/181,402, filed Jul. 29, 2008, Iwai et al.
Fumio Kawamura et al., "*Novel Liquid Phase Epitaxy (LPE) Growth Method for Growing Large GaN Single Crystals: Introduction of the Flux Film Coated-Liquid Phase Epitaxy (FFC-LPE) Method*," Japan Journal of Applied Physics, vol. 42 (2003), pp. L-879-L881.

\* cited by examiner (a)

(b)

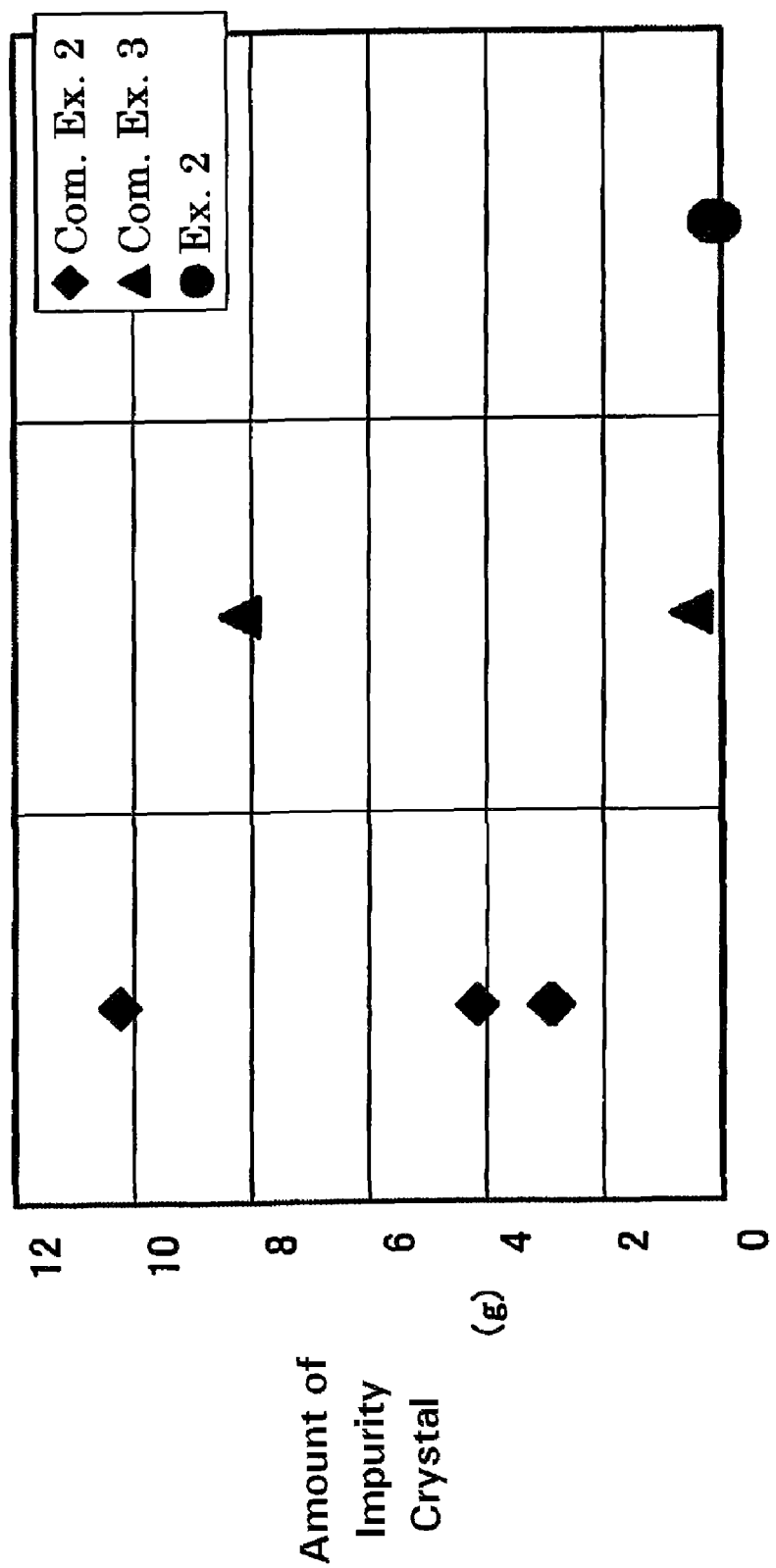

SINGLE CRYSTAL GROWING METHOD

CROSS REFERENCE AND RELATED APPLICATIONS

Application Ser. No. 12/190,230 is a continuation of PCT/JP2007/054744 filed Mar. 5, 2007.

FIELD OF THE INVENTION

The present invention relates to a method of growing a single crystal.

BACKGROUND OF THE INVENTION

Gallium nitride-based III-V group nitride, which is attracting attention as an excellent blue light emitting element, is put into practical use in light emitting diode, and expected also as a blue-violet semiconductor laser element for light pick-up. According to the method of growing GaN single crystal, described in "Jpn. J. Appl. Phys." Vol. 42 (2003), pp. L879-L881, a boron nitride growth vessel is placed within a pressure-resistant container, metal Ga of group-III raw material and Na as flux are put in the boron nitride growth vessel, and nitrogen gas is supplied into the pressure-resistant container at high pressure. Nitrogen of group-V raw material is dissolved to a Ga—Na mixed melt under heating and pressurizing to thereby grow the GaN single crystal on a seed crystal substrate within the growth vessel. In that case, the boron nitride growth vessel is oscillated by mounting a rotary shaft on an electric furnace containing the boron nitride growth vessel, connecting the rotary shaft to a motor shaft, and operating the motor.

SUMMARY OF THE INVENTION

However, it is known that the crystal growth by flux method using such heating and pressurizing apparatus involves the following problem. Namely oscillation of the vessel may facilitate generation of unnecessary crystal or so-called "impurity crystar", which results from natural nucleation in the growing raw material. The impurity crystal means a crystal which is composed of, for example, GaN single crystal, but unusable due to a crystal orientation or shape differed from that of a desired single crystal. The impurity crystal may be not only adhered onto a predetermined single crystal, but also buried in the single crystal, as shown in FIG. 8. Therefore, the impurity crystal can be hardly removed from the single crystal by processing such as polishing, resulting in a defective single crystal. Even if the seed crystal is immersed in the bottom of the growth vessel, the impurity crystal resulting from natural nucleation generates in the vicinity of a gas-liquid interface of the flux and descends toward the seed crystal. The impurity crystal by natural nucleation descending from the vicinity of the gas-liquid interface toward the bottom adheres onto a growing single crystal. Further, consumption of the gallium of raw material by the impurity crystal reduces the use efficiency of raw material.

An object of the present invention is thus to prevent generation of impurity crystal during growth of a single crystal by melting a raw material within a vessel under a nitrogenous non-oxidizing atmosphere.

A first aspect of the invention provides a method of growing a single crystal by melting a raw material within a vessel under a nitrogenous and non-oxidizing atmosphere, while the vessel is oscillated and the melted raw material is contacted with an agitation medium, at least a surface of said agitation medium comprising a material unreactive with the melted raw material.

A second aspect of the invention provides a method of growing a single crystal by melting nitrogen into a melted raw material within a vessel under a nitrogenous and non-oxidizing atmosphere, while the melted raw material is contacted with an agitation medium, the vessel is rotated upon itself around an axis of rotation inclined with respect to the vertical line, at least a surface of the agitation medium comprises a material unreactive with the melted raw material.

According to the first aspect, the generation of impurity crystal can be remarkably suppressed to prevent product failure by adhesion of the impurity crystal, by putting the agitation medium composed of an unreactive solid in the vessel, and oscillating the vessel with the agitation medium being in contact with the raw material melt. Without the agitation medium, the generation of impurity crystal cannot be prevented even by oscillating the vessel in the same oscillation condition.

According to the second aspect, the generation of impurity crystal can be also prevented, by putting the agitation medium in the vessel, in crystal growth with rotation of the growth vessel upon itself, and inclining the rotational axis of the vessel to the vertical line. Further, the agitation medium tends to stay at the lowest position within the vessel by the gravitational effect since the rotational axis is inclined to the vertical line.

As a result, a relative motion is caused between the agitation medium and the vessel, and the effect of agitation can be thereby improved. Consequently the crystals are uniformly grown with reduced uneven agitation. Since the agitation medium tends to stay at the lowest position within the vessel, the agitation medium has a low chance of passing over a crystal which is generally not located at the lowest position within the vessel, and the crystal is thus secure from damage.

BRIEF DESCRIPTION OF THE DRAWINGS

FIG. 8 is a graph showing generation of impurity crystal in Example 2 and Comparative Examples 2 and 3.

DETAILED DESCRIPTION OF THE INVENTION

The present invention will be described further in detail in reference to the accompanying drawings.

A group-III raw material, a flux raw material and agitation media are encapsulated within a globe box laid into a non-oxidizing atmosphere, and encapsulated in an inner space 1$a$ of a vessel 1 (refer to FIGS. 1, 2 and 3) under the non-oxidizing atmosphere. The vessel may be provided with a lid. A seed crystal substrate 11 is set on the bottom of the vessel 1. The vessel 1 is placed within a sealable and gas-introducible outer container 2, and the outer container 2 is taken out of the globe box to set within a crystal growing apparatus as it is.

Figure 1:
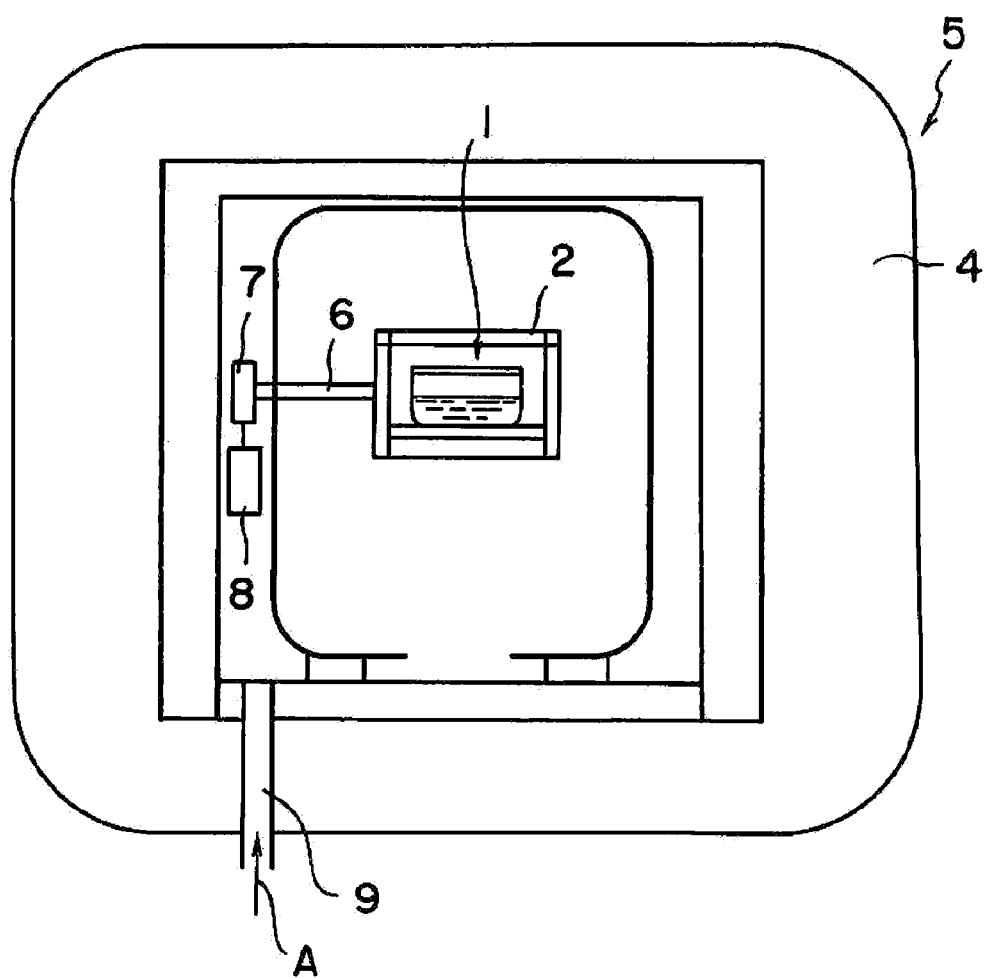
FIG. 1 is a schematic view, showing a state where a growth vessel 1 and an outer container 2 are set in an HIP apparatus.

In the example shown FIG. 1, for example, the outer container 2 and the growth vessel 1 are set within a pressure vessel 4 of an HIP (hot isostatic pressing) apparatus 5. A mixed gas cylinder not shown is provided outside the pressure vessel 4. The mixed gas cylinder is filled with a mixed gas of a predetermined composition, and the mixed gas is compressed to a predetermined pressure by a compressor and supplied into the pressure vessel 4 through a feed pipe 9 as shown by arrow A. Nitrogen in the atmosphere is used as a nitrogen source, and an inert gas thereof such as argon gas inhibits vaporization of flux. The pressure of the atmosphere is monitored by a pressure gauge not shown. A heater not shown is set in the circumference of the outer container 2 and the growth vessel 1 so that the growth temperature in the growth vessel 1 can be controlled.

When the vessel 1 is heated and pressurized within the pressure vessel 4, the raw materials are completely melted within the vessel 1 to form a mixed melt 10. If a predetermined single crystal growing condition is retained therein, nitrogen is stably supplied from the space 1$a$ within the growth vessel into the mixed melt 10, and a single crystal film is grown on the seed crystal substrate 11.

Figure 2:
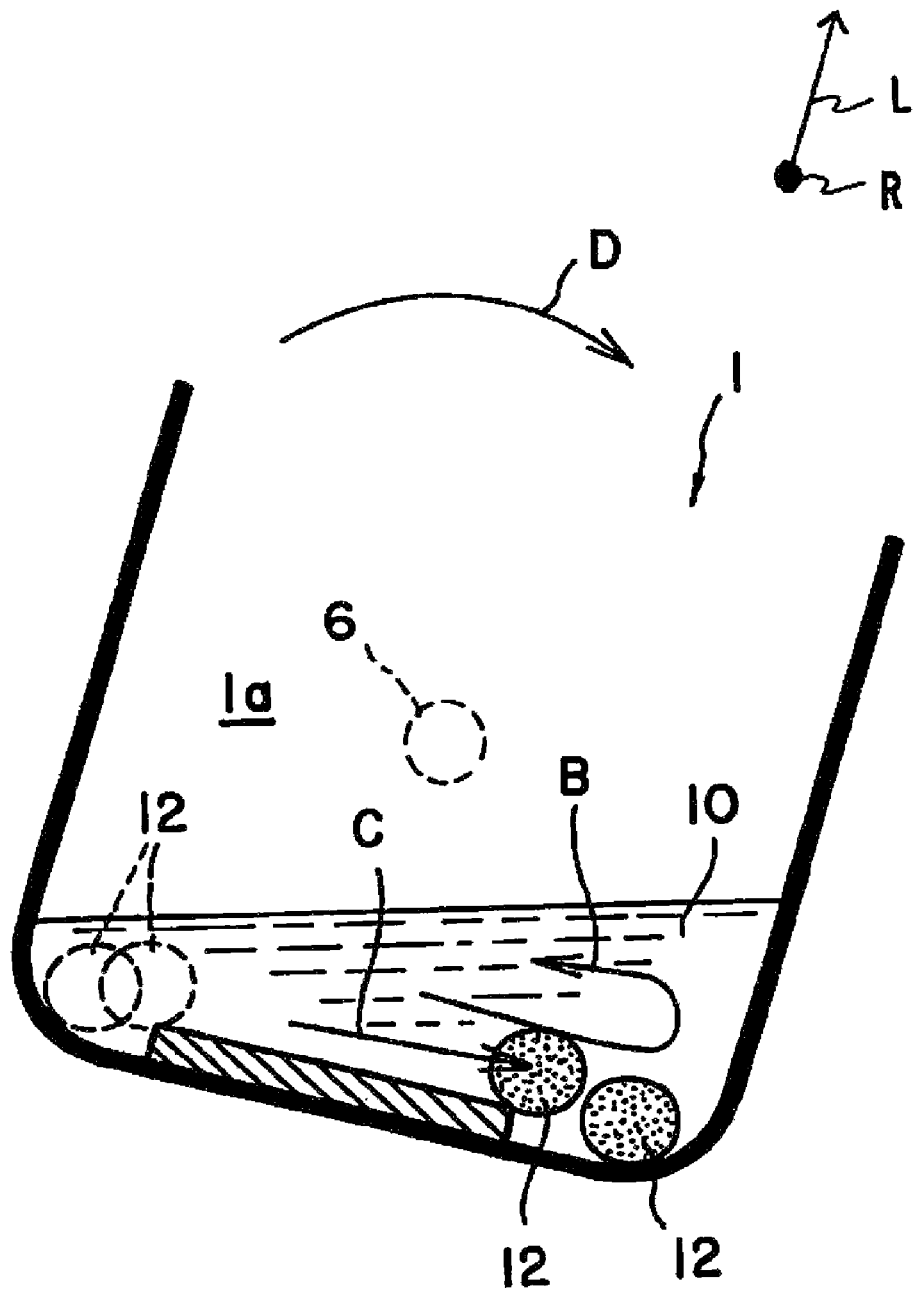
FIG. 2 is a sectional view, schematically showing a state where a raw material is melted in the growth vessel 1 to grow a single crystal, with the growth vessel 1 being oscillated.
Figure 3:
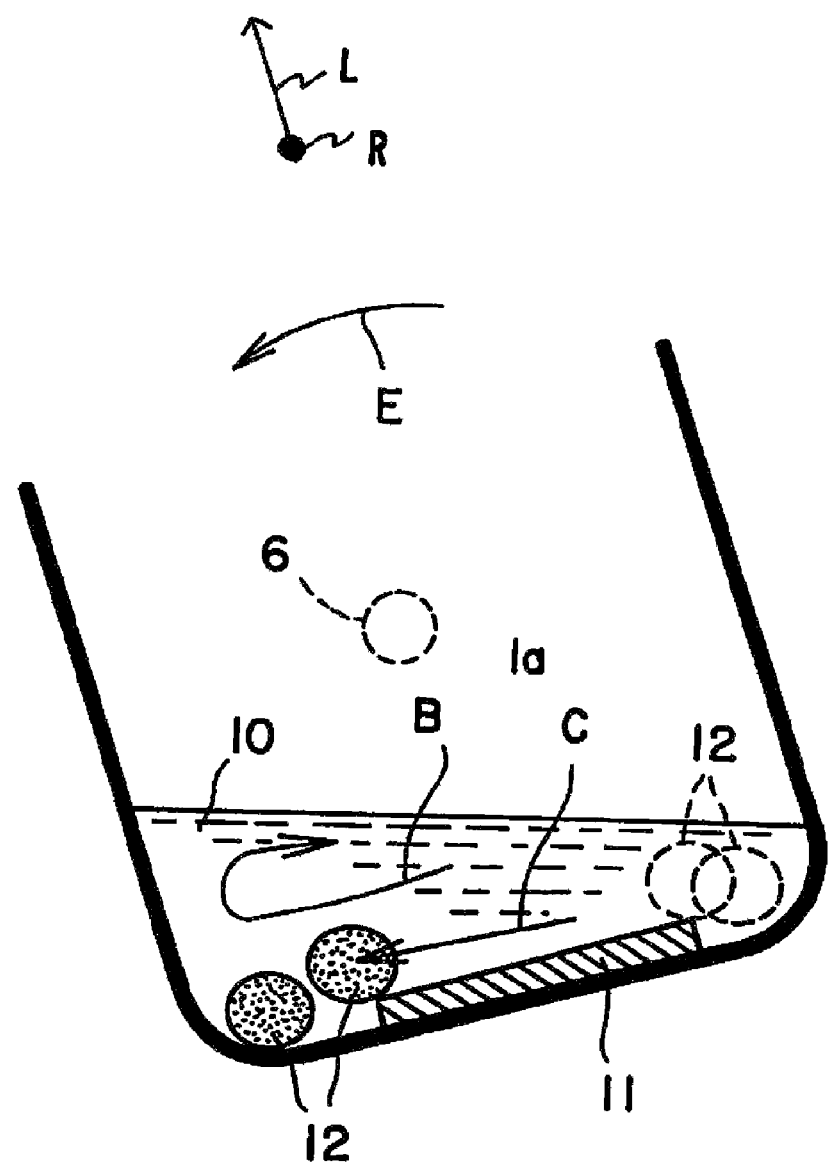
FIG. 3 is a sectional view, schematically showing a state where a raw material is melted in the growth vessel 1 to grow a single crystal, with the growth vessel 1 being oscillated.

As shown in FIG. 1, for example, a rotary shaft 6 is mounted on the outer container 2, so that the rotary shaft 6 is rotatable by supplying power from a power source 8 to a motor 7. The outer container and the growth vessel 1 are made rotatable thereby in a direction vertical to the paper plane in FIG. 1. In this state, the single crystal substrate 11 and agitation media 12 are immersed in the flux 10 as shown in FIGS. 2 and 3. The growth vessel is oscillated as shown by arrows D and E in FIGS. 2 and 3 during single crystal growth. The oscillating direction is vertical to the paper plane in FIG. 1 and parallel to the paper plane in FIGS. 2 and 3. In FIGS. 2 and 3, the rotary shaft 6 is shown by a dotted line.

The agitation media 12 are moved as shown by arrow C within the growth vessel 1 to create a flow as shown by arrow B in the mixed melt. Namely as shown by the arrow B, the mixed melt flows in the vicinity of the single crystal substrate 11, then inverts and ascends just before the inner wall surface of the growth vessel, and flows near the liquid surface of the mixed melt 10. It was found that this flow can inhibit the generation of impurity crystal near the liquid surface. It was also found that, without the agitation media, the generation of impurity crystal cannot be inhibited due to insufficient agitation of the mixed melt, particularly in the vicinity of a gas-liquid interface of the mixed melt, even if the growth vessel is surely oscillated as shown by the arrows D and E.

In a first embodiment of the invention, the vessel is preferably set with an inclination from a horizontal plane. Namely the vessel is preferably oscillated with the central axis of the vessel being inclined to the oscillating plane. According to this, the agitation medium tends to stay at the lowest position within the vessel by the gravitational effect. As a result, a relative motion is caused between the agitation medium and the vessel, and the effect of agitation can be thereby improved. Consequently the crystals are uniformly grown with reduced uneven agitation. Since the agitation medium tends to stay at the lowest position within the vessel, the agitation medium has a low chance of passing over a crystal which is generally not located at the lowest position within the vessel, and the crystal is thus secure from damage. Further, since the possibility of random collision between spheres is also minimized, the spheres are less likely to be damaged, and possible inclusion of impurities is reduced.

Figure 4:
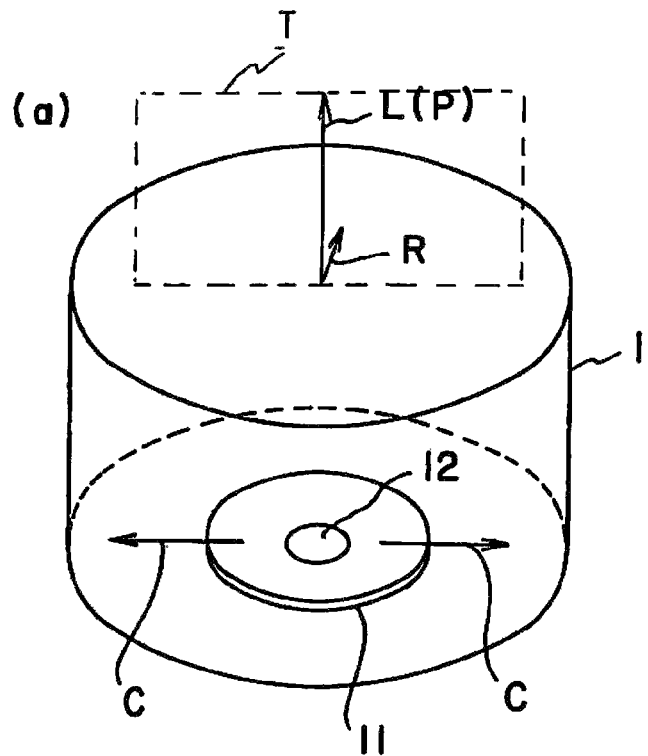
FIG. 4(a) is a perspective view, illustrating movement of an agitation medium 12 when the growth vessel 1 is horizontally set and oscillated.
FIG. 4(b) is a plan view, illustrating movement of the agitation medium 12 when the growth vessel 1 is horizontally set and oscillated.
Figure 4:
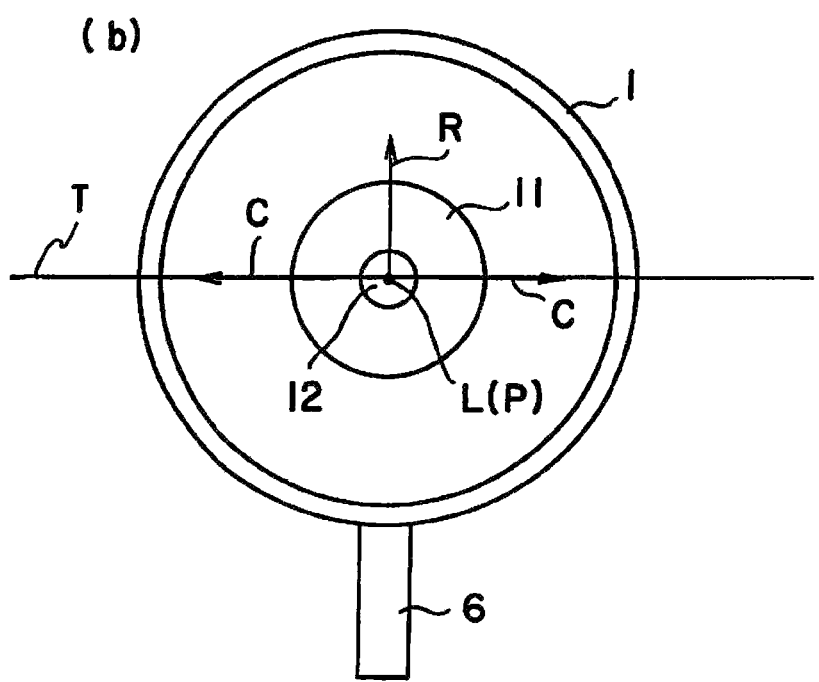

For example, FIG. 4($a$) is a perspective view illustrating movement of the agitation medium 12 in the vessel 1 which is horizontally set, and FIG. 4($b$) is a plan view illustrating movement of the agitation medium 12 in the vessel 1 which is horizontally set.

In the figures, denoted at L is central axis of the vessel 1, P is vertical line, R is oscillating axis, and T is oscillating plane. The oscillating plane T is defined as a plane vertical to the oscillating axis R. In this embodiment, L is matched with P during rest. The oscillating axis R of the vessel 1 is perpendicular to the central axis L and the vertical line P, and the central axis L of the vessel is located within the oscillating plane T. When the vessel 1 is oscillated around the oscillating axis R as shown in FIGS. 1 to 3 in this state, the agitation media 12 roll as shown by arrow C within the vessel 1. In such case, the agitation media have flexibility of rolling toward directions other than the arrow C direction, with the rolling direction thereof being unsettled since the bottom of the vessel 1 is substantially flat and horizontal. Consequently collision of the agitation media with a growing crystal or strong collision between the agitation media might be caused.

Figure 5:
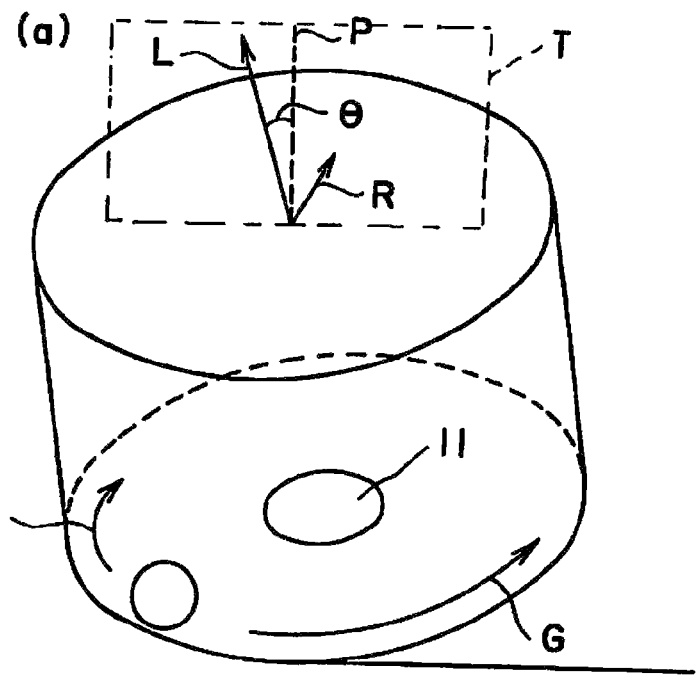
FIG. 5(a) is a perspective view, illustrating movement of the agitation medium 12 when the growth vessel 1 is oscillated with the central axis L of the vessel 1 being inclined to an oscillating plane T.
FIG. 5(b) is a plan view, illustrating movement of the agitation medium 12 when the growth vessel 1 is oscillated with the central axis L of the vessel 1 being inclined to the oscillating plane T.
Figure 5:
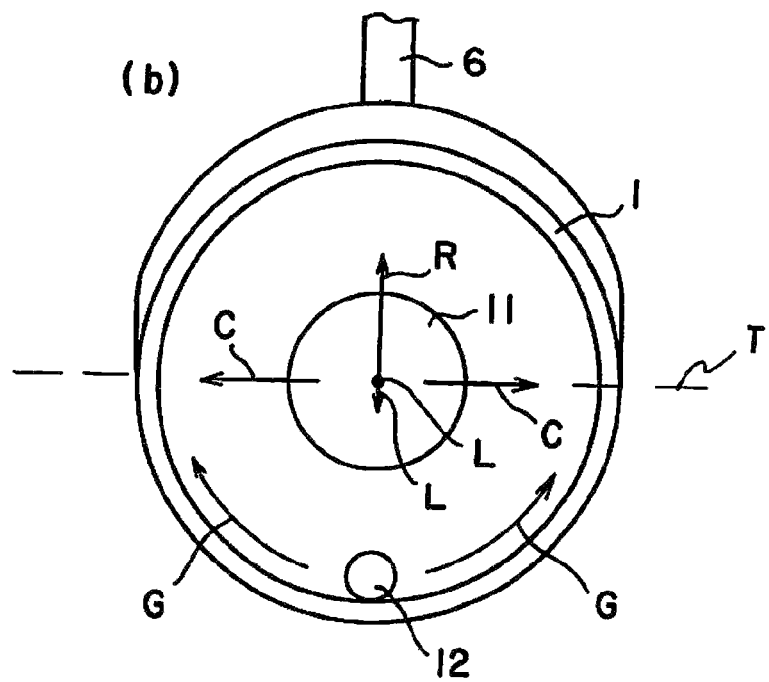
Figure 6:
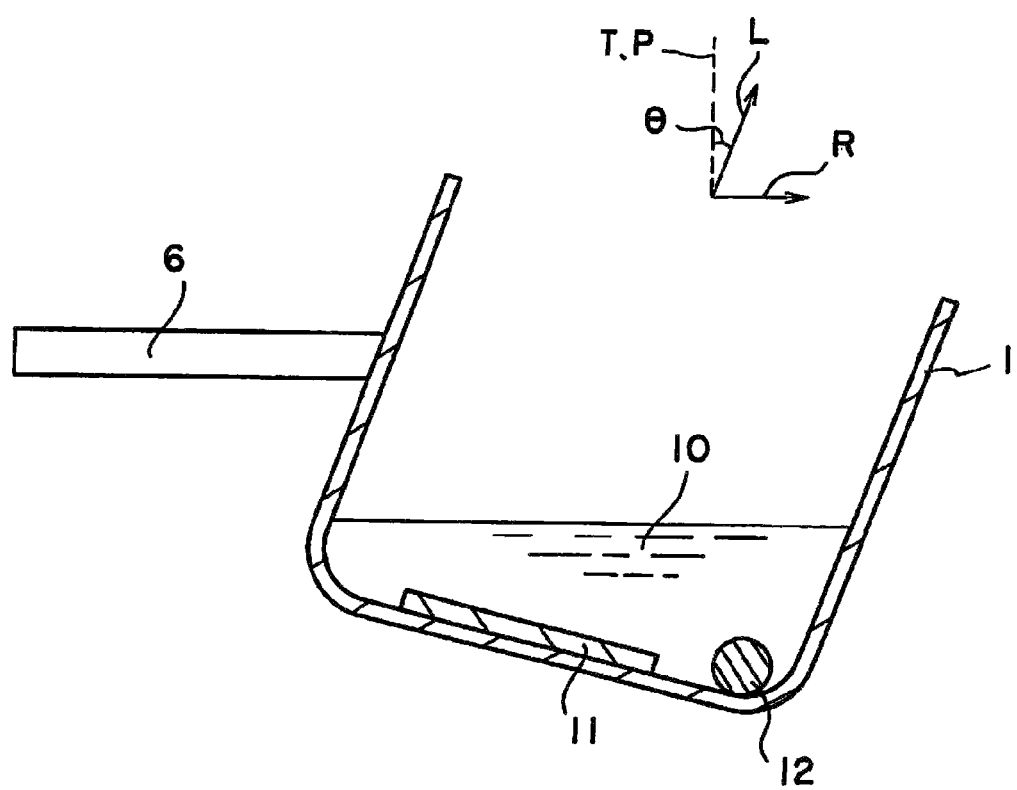
FIG. 6 is a sectional view, schematically showing the inside state of the growth vessel 1.

FIG. 5($a$) is a perspective view illustrating movement of the agitation medium 12 in the vessel 1, the central axis L of which is inclined by angle θ to the oscillating plane T, and FIG. 5($b$) is a plan view illustrating movement of the agitation medium 12 in the vessel 1, the central axis L of which is inclined to the oscillating plane T in a direction of the oscillating axis. FIG. 6 is a sectional view schematically showing the inside state of the vessel 1.

In this embodiment, crystal growth is performed while oscillating the growth vessel 1 along the oscillating axis R. At that time, the agitation media 12 are put in the vessel 1, and the central axis L of the vessel 1 is inclined to the oscillating plane T. According to this, the agitation media 12 tend to stay at the lowest position within the vessel 1 by the gravitational effect. As a result, a relative motion is caused between the agitation media 12 and the vessel 1, and the effect of agitation can be thereby improved. Consequently the crystals are uniformly grown with reduced uneven agitation. Since the agitation media 12 tend to stay at the lowest position within the vessel 1, the agitation media 12 have a low chance of passing over a crystal 11 which is generally not located at the lowest position within the vessel, and the crystal is thus secure from damage. Further, since the possibility of random collision between the agitation media is also minimized, the agitation media are less likely to be damaged, and possible inclusion of impurities is reduced.

In the first embodiment of the invention, when the central axis L of the vessel is inclined to the oscillating plane T, the inclination angle θ is set preferably to 5° or more, from the point of the effect, more preferably to 10° or more. For preventing spill of the melt, the angle is set preferably to 45° or less, more preferably to 30° or less.

Figure 7:
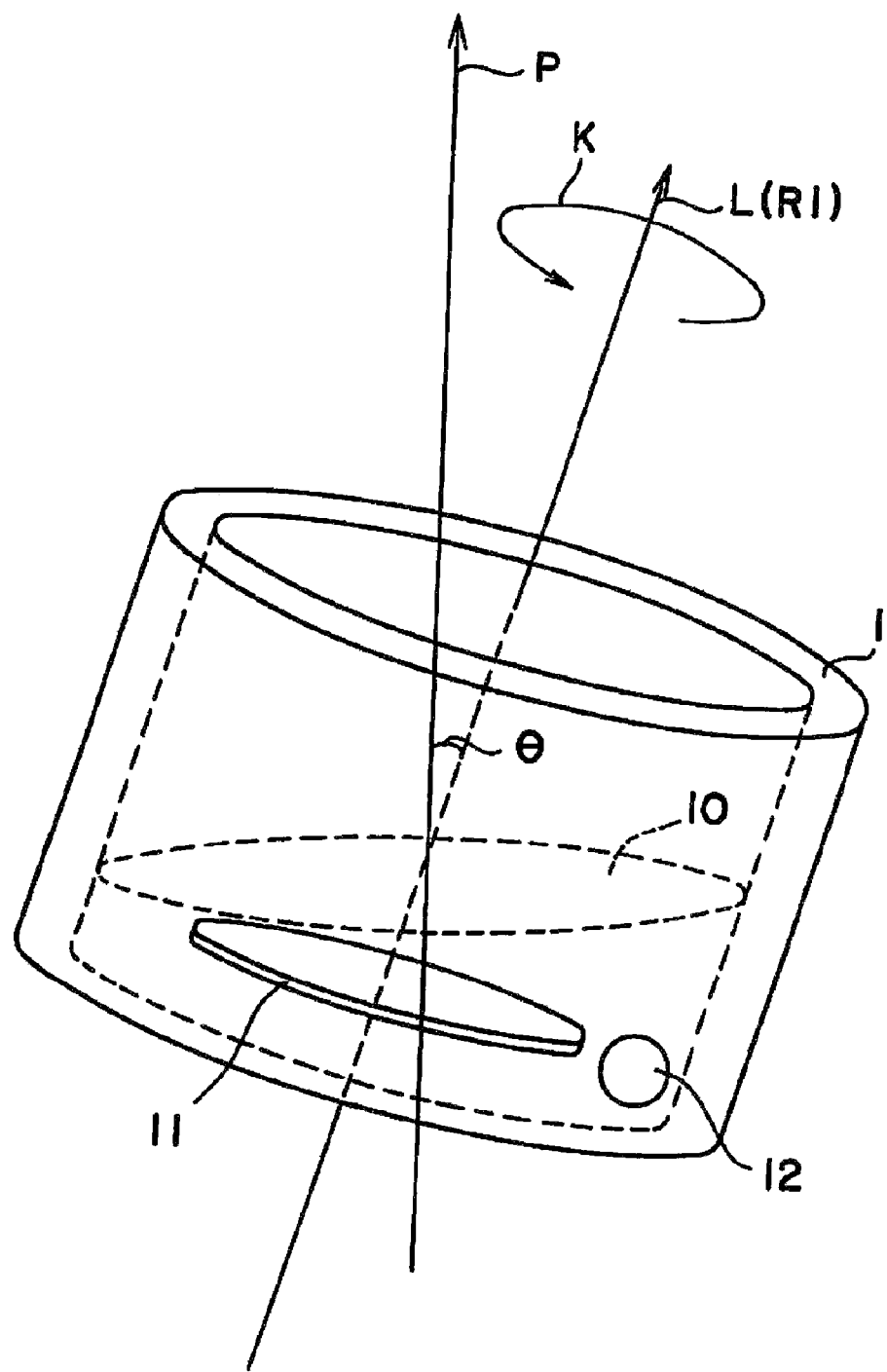
FIG. 7 is a perspective view of the growth vessel 1 wherein an rotational axis R1 of the vessel 1 is inclined to a vertical line P.

FIG. 7, which relates to a second embodiment of the invention, is a perspective view of the vessel 1, the rotational axis R1 of which is inclined to the vertical line P.

In this embodiment, crystal growth is performed while rotating the growth vessel 1 around the rotational axis R1. At that time, the agitation media 12 are put in the vessel 1, and the rotational axis R1 of the vessel 1 is inclined to the vertical line P. The agitation media 12 tend to stay at the lowest position within the vessel 1 by the gravitational effect.

As a result, a relative movement is caused between the agitation media 12 and the vessel 1, and the effect of agitation can be thereby improved. Consequently the crystals are uniformly grown with reduced uneven agitation. Since the agitation media 12 tend to stay at the lowest position within the vessel 1, the agitation media 12 have a low chance of passing over the crystal 11 which is generally not located at the lowest position in the vessel, and the crystal is thus secure from damage. Further, since the possibility of random collision between the agitation media is also minimized, the agitation media are less likely to be damaged, and possible inclusion of impurities is reduced.

In the second embodiment of the invention where the rotational axis R1 of the vessel is inclined to the vertical line P, the inclination angle θ is set preferably to 5° or more, from the point of the effect, more preferably to 10° or more. For preventing spill of the melt, the inclination angle is set preferably to 45° or less, more preferably to 30° or less.

In the present invention, the kind of the non-oxidizing atmosphere is not particularly limited and, for example, an inert gas atmosphere of nitrogen, argon or the like and a reductive atmosphere of carbon monoxide, hydrogen or the like are adaptable. The present invention is particularly suitable to a nitrogenous atmosphere. The nitrogenous atmosphere may be composed of only nitrogen, but can contain a non-oxidizing gas other than nitrogen, e.g., an inert gas such as argon or a reductive gas.

In the present invention, the heating (and preferably pressurizing) apparatus used for crystal growth is not particularly limited. As such apparatus, a hot isostatic pressing apparatus is preferred, but other atmospheric pressurizing heating furnaces are also usable.

The flux preferably contains one or more metal(s) selected from the group consisting of alkali metals and alkali earth metals. As such metal, sodium, lithium and calcium are particularly preferred, and sodium is most preferred.

In addition to the above-mentioned metal, a metal, for example, potassium, rubidium, cesium, magnesium, strontium, barium or tin can be added to the flux.

Further, a dopant such as silicon can be added thereto.

The growing method of the present invention is suitable for growth of single crystals, for example, GaN, AlN, InN, mixed crystal thereof (AlGaInN), and BN.

In the present invention, it is necessary that the material of the solid constituting at least the surface region of the agitation medium is unreactive with the flux. Therefore, such material is properly selected by those skilled in the art according to the kind of the flux used. The whole body of the agitation medium may be formed of such material, or only the surface of the agitation medium may be formed of such material. In application to a flux containing alkali metal or alkali earth metal, generally metallic tantalum is most preferably used as the material of the agitation medium. However, it was found that metal such as metallic tungsten or metallic molybdenum, oxide ceramics such as alumina, yttria or calcia, single crystal such as sapphire, carbide ceramics such as tungsten carbide or tantalum carbide, nitride ceramics such as aluminum nitride, titanium nitride or zirconium nitride are also usable. Otherwise, the surface of a solid composed of another material can be covered with the material unreactive with the growing raw material melt as described above. Therefore, an agitation medium obtained, for example, by covering a steel ball with metallic tantalum is also preferably used.

The agitation medium is preferably composed of a bulk body having, preferably a shape easy to roll on an inclined surface, but the shape is not particularly limited to. Concrete examples thereof include a rotator such as sphere or spheroid, a pyramid such as triangular pyramid, quadrangular pyramid or hexagonal pyramid, a cone and a polyhedron such as cube.

As the agitation medium is larger, the effect for preventing generation of impurity crystal by agitation is higher. From this viewpoint, each agitation medium preferably has a diameter of 1 mm or more, more preferably 5 mm or more. However, since an extremely large size of the agitation medium results in an increased weight thereof, the diameter is set preferably to 15 mm or less, more preferably to 10 mm or less.

The number of agitation media in the growth vessel is not particularly limited, but may be set to 10 or less since the effect is unchanged if the number is increased beyond a certain degree. Even if the number of agitation media is one, the effect for prevention of impurity crystal can be sufficiently exhibited.

Each agitation medium has only to be in contact with the growing raw material melt, and the agitation media are not needed to be entirely immersed in the raw material melt. However, from the point of the effect for prevention of impurity crystal, the agitation media are preferably immersed in the raw material melt.

The oscillating angle in oscillation of the growth vessel is not particularly limited. However, for enhancing the effect for prevention of impurity crystal, the angle is set preferably to 5° or more, more preferably to 10° or more. From the point of preventing troubles by collision of the agitation media to the seed crystal within the growth vessel, the oscillating angle in oscillation of the growth vessel is set preferably to 30° or less, more preferably to 20° or less. The oscillating angle referred to herein means an inclination angle from the vertical line.

The oscillating period in oscillation of the growth vessel is set preferably to 1 rpm or more, for enhancing the effect for prevention of impurity crystal, more preferably to 5 rpm or more. From the point of preventing troubles by collision of the agitation media to the seed crystal within the growth vessel, the oscillating period in oscillation of the growth vessel is set preferably to 20 rpm or less, more preferably to 15 rpm or less.

When the vessel is rotated on itself around the rotational axis, the rotating rate is set preferably to 1 rpm or more, for enhancing the effect for prevention of impurity crystal, more preferably to 5 rpm or more. From the point of preventing troubles by collision of the agitation media to the seed crystal within the growth vessel, the rotating rate is set preferably to 120 rpm or less, more preferably to 60 rpm or less.

The heating temperature and pressure in the present invention are not particularly limited since they are selected depending on the kind of single crystals. The heating temperature can be set to, for example, 800 to 1200° C. The upper limit thereof can be set to, for example, 1500° C. or lower although it is not particularly regulated. The pressure is not particularly limited, but is set preferably to 1 MPa or more, more preferably to 5 MPa or more in an embodiment in which means for introducing gas into a sealed container breaks or removes sealing means by pressure. The upper limit of the pressure can be set to, for example, 200 MPa or less although it is not particularly defined.

The material forming the growth vessel may be any airtight material which is durable to the raw material used or an intended heating and pressurizing condition without particular limitation. Examples of such material include ceramics such as alumina or BN, metallic tantalum, metallic tungsten, p-BN, and p-Gr (pyrographite).

Further concrete single crystals and growing procedures thereof will be described.

(Growth Example of Gallium Nitride Single Crystal)

In the present invention, a gallium nitride single crystal can be grown using a flux containing at least sodium metal. A gallium raw material is mixed to the flux. As the gallium raw material, gallium single metal, a gallium alloy and a gallium compound are applicable, and gallium single metal is suitably used from the point of handling.

The flux may include a metal other than sodium, for example, lithium. Although the gallium raw material and the flux raw material such as sodium may be used in an appropriate proportion, excess use of Na is generally considered. This is, of course, not limitative.

In this embodiment, growth of gallium nitride single crystal is carried out under an atmosphere consisting of a mixed gas containing nitrogen gas at a total pressure ranging from 300 atm to 2000 atm. By setting the total pressure to 300 atm or more, a gallium nitride single crystal of good quality could be grown, for example, in a high-temperature area of 900° C. or higher, more preferably in a high-temperature area of 950° C. or higher. The reason thereof is not known exactly but this is attributable to that the nitrogen solubility is increased according to temperature rise, and nitrogen efficiently dissolves in the growth solution. When the total pressure of the atmosphere is set to 2000 atm or more, the density of the high-pressure gas significantly gets close to that of the growth solution, so that it becomes difficult to retain the growth solution within the growth vessel.

TABLE 1

Densities of various materials (g/cm³)

| | Sodium metal | Nitrogen | Argon |
|---|---|---|---|
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (speculation) | 0.5 (speculation) |

In a preferred embodiment, the nitrogen partial pressure in the growing atmosphere is set to 100 atm or more and 2000 atm or less. By setting the nitrogen partial pressure to 100 atm or more, dissolution of nitrogen to the flux could be promoted in a high-temperature area of, for example, 1000° C. or higher to grow the gallium nitride single crystal of good quality. From this point of view, the nitrogen partial pressure in the atmosphere is set more preferably to 200 atm or more. Further, the nitrogen partial pressure is set preferably to 1000 atm or less from the practical point of view.

The gas other than nitrogen in the atmosphere is not limited, but an inert gas is preferred, and argon, helium or neon is particularly preferred. The partial pressure of the gas other than nitrogen corresponds to a value obtained by subtracting the nitrogen gas partial pressure from the total pressure.

In a preferred embodiment, the growth temperature of gallium nitride single crystal is set to 950° C. or higher, more preferably to 1000° C. or higher, and even in such a high-temperature area, gallium nitride single crystal of good quality can be grown. The growth at high temperature and high pressure has the possibility of improving the productivity.

The upper limit of the growing temperature of gallium nitride single crystal is not particularly limited, but is set preferably to 1500° C. or lower since an excessively high growth temperature makes the crystal grow difficult. From this viewpoint, the upper limit is set more preferably to 1200° C. or lower.

Examples of the material of the growth substrate for epitaxially growing the gallium nitride crystal include sapphire, AlN template, GaN template, silicon single crystal, SiC single crystal, MgO single crystal, spinel (MgAl$_2$O$_4$), and perovskite composite oxide such as LiAlO$_2$, LiGaO$_2$, LaAlO$_3$, LaGaO$_3$, NdGaO$_3$, but are not limited to. A cubic perovskite composite oxide represented by the composition formula [Al$_{1-y}$(Sr$_{1-x}$Ba$_x$)$_y$] [(Al$_{1-z}$Ga$_x$)$_{1-u}$·Du]O$_3$ (wherein A is rare earth element; D is one or more element(s) selected from the group consisting of niobium and tantalum; y=0.3 to 0.98; x=0 to 1; z=0 to 1; u=0.15 to 0.49; and x+z=0.1 to 2) may be also used. Further, SCAM (ScAlMgO$_4$) is also usable.

(Growth Example of AlN Single Crystal)

It was confirmed that the present invention is effective for growth of AlN single crystal by pressurizing a melt containing a flux including at least aluminum and alkali earth metal in a specific condition under a nitrogenous atmosphere.

EXAMPLES

Example 1

A gallium nitride single crystal film was grown on a seed crystal substrate 11 according to the method described above in reference to FIGS. 1 to 3.

Concretely metallic sodium 30g, metallic gallium 20g, and metallic lithium 30 mg were weighed within a globe box. These raw materials were charged in an alumina growth vessel 1 with inside diameter φ of 80 mm. The seed crystal substrate 11 was set on the bottom of the growth vessel 1. As the seed crystal substrate 11, an AlN template substrate, a GaN template substrate or a GaN single crystal self-supporting substrate with φ of 2 inches was used. The substrate 11 was horizontally disposed on the bottom of the growth vessel 1 so that the single crystal thin film of the template is upward, or the Ga surface of the GaN single crystal self-supporting substrate is upward. The AlN template means a template obtained by forming an AlN single crystal epitaxial thin film on a sapphire single crystal substrate. The GaN template substrate means a substrate obtained by forming a GaN single crystal epitaxial thin film on a sapphire substrate. Although the template may have a proper film thickness, not less than a thickness such that it melts back at the start of growth is needed. The film thickness can be set, for example, to 1 micron or more for the AlN template which is more difficult to melt back than the GaN template, and to 3 microns or more for the GaN template.

In addition to the substrate, ten metallic tantalum balls ¼ inch in diameter were put in the growth vessel 1. The vessel 1 was then set within the apparatus shown in FIG. 1, and pressurized with nitrogen gas to 3.5 MPa. The vessel was held at 870° C. for 100 hours to grow GaN single crystal, with an oscillation period of 5 rpm, and an oscillating angle of 15°. After naturally allowed to cool to room temperature, the growth vessel 1 was taken out of the growth apparatus, and Na and Li were dissolved by treatment in ethanol. Thereafter, remaining Ga was removed by immersing in diluted hydrochloric acid to take out GaN single crystal. The GaN single crystal had a substantially circular shape with a size of 2 inch and a thickness of about 3 mm. The crystal was substantially colorless and transparent. Crack or intake of impurity crystal was not observed.

Comparative Example 1

Growth of GaN single crystal was performed in the same manner as in Example 1, except no metallic tantalum ball was put in the growth vessel 1. The oscillation of the growth vessel was performed with an oscillating period of 5 rpm and an oscillating angle of 15°. The resulting GaN single crystal had a substantially circular shape with a size of 2 inch and a thickness of about 3 mm. However, intake of impurity crystal was observed.

Example 2, Comparative Examples 2 and 3

Growth of single crystal was carried out in the same manner as Example 1. In Comparative Example 2, the vessel 1 was not oscillated (Frequency of experiments: 3). In Comparative Example 3, the vessel 1 was oscillated without putting the agitation media therein (Frequency of experiments: 2). In Example 2, the vessel 1 was oscillated while putting two tungsten carbide balls 7 mm in diameter therein (Frequency of experiments: 2). The weights of impurity crystals in the respective examples are shown in FIG. 4. The generation quantity of impurity crystal with oscillation of the vessel (Comparative Example 3) is high in some cases and low in some cases, compared with the case without oscillation (Comparative Example 2). The oscillation of the vessel with the agitation media (Example 2) is almost free from generation of impurity crystal, and apparently effective.

Example 3

Growth of single crystal was carried out in the same manner as Example 1, except the central axis L of the growth vessel 1 was inclined by 20° to the oscillating plane T as shown in FIGS. 5 and 6. Others were the same as Example 1. As a result, uniformity of crystals was further improved, compared with the case of horizontally setting the vessel. The yield was improved without damage of the crystals.

Example 4

Growth of single crystal was carried out in the same manner as Example 1, except the oscillating shown in FIGS. 1 to 3 was not performed. Instead, the central axis L and rotational axis R1 of the growth vessel 1 were inclined at 20° to the vertical line P. The rotating rate was 30 rpm. Others were the same as in Example 1. As a result, uniformity of crystals was further improved, compared with the case of horizontally setting the vessel. The yield was improved without damage of the crystals.

While specific preferred embodiments have been shown and described, the present invention is never limited by these specific embodiments, and can be carried out with various modifications without departing from the scope of the claims.

The invention claimed is:

1. A method of growing a single crystal by melting nitrogen in a melted raw material within a vessel having a central axis "L" and a bottom face under a nitrogenous and non-oxidizing atmosphere, the method comprising:
   immersing a seed crystal and an agitation medium in a melted raw material, wherein said agitation medium has a spherical shape and at least a surface of said agitation medium comprises a material unreactive with the melted raw material;
   while the melted raw material is in contact with said agitation medium, oscillating the vessel around a rotating axis "R" with the central axis "L" of the vessel inclined at an angle θ with respect to an oscillating plane "T" that is perpendicular to the rotating axis "R" so that the agitation medium rolls on the bottom face of the vessel; and
   growing the single crystal on the seed crystal.

2. The method of claim 1, wherein the material of the agitation medium is selected from the group consisting of tantalum metal, tungsten metal, molybdenum metal, alumina, sapphire, yttria, calcia, aluminum nitride, silicon nitride, titanium nitride, zirconium nitride, boron nitride, tantalum carbide, tungsten carbide and diamond-like carbon.

3. The method of claim 1, wherein the spherical agitation medium has a diameter of 1 mm or more and 15 mm or less.

4. The method of claim 1, wherein the number of the agitation media within the vessel is 1 or more and 10 or less.

5. The method of claim 1, wherein the single crystal comprises a nitride single crystal.

6. The method of claim 1, wherein the growth of the single crystal is carried out within a hot isostatic pressing apparatus.

7. A method of growing a single crystal by melting nitrogen in a melted raw material within a vessel comprising a bottom face under a nitrogenous and non-oxidizing atmosphere, the method comprising:
   immersing a seed crystal and an agitation medium in the melted raw material, wherein the agitation medium has a spherical shape;
   while the melted raw material is in contact with the agitation medium, rotating the vessel upon itself around an axis "R1" of rotation inclined at an angle θ with respect to vertical line "P" so that the agitation medium is rolled on the bottom face of the vessel, wherein at least a surface of the agitation medium comprises a material unreactive with the melted raw material; and
   growing the single crystal on the seed crystal.

8. The method of claim 7, wherein the material of the agitation medium is selected from the group consisting of tantalum metal, tungsten metal, molybdenum metal, alumina, sapphire, yttria, calcia, aluminum nitride, silicon nitride, titanium nitride, zirconium nitride, boron nitride, tantalum carbide, tungsten carbide and diamond-like carbon.

9. The method of claim 7, wherein the number of the agitation media within the vessel is 1 or more and 10 or less.

10. The method of claim 7, wherein the single crystal comprises a nitride single crystal.

11. The method of claim 7, wherein the growth of the single crystal is carried out within a hot isostatic pressing apparatus.

* * * * *